:::
(12) United States Patent  
Murakami et al.

(10) Patent No.: US 11,965,242 B2  
(45) Date of Patent: Apr. 23, 2024

(54) RAW MATERIAL SUPPLY APPARATUS AND RAW MATERIAL SUPPLY METHOD

(71) Applicant: Tokyo Electron Limited, Tokyo (JP)

(72) Inventors: Seishi Murakami, Nirasaki (JP); Tsuneyuki Okabe, Nirasaki (JP); Eiichi Komori, Nirasaki (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 220 days.

(21) Appl. No.: 17/761,067

(22) PCT Filed: Sep. 15, 2020

(86) PCT No.: PCT/JP2020/034971  
§ 371 (c)(1),  
(2) Date: Mar. 16, 2022

(87) PCT Pub. No.: WO2021/060084  
PCT Pub. Date: Apr. 1, 2021

(65) Prior Publication Data  
US 2022/0341037 A1 Oct. 27, 2022

(30) Foreign Application Priority Data  
Sep. 24, 2019 (JP) .................................. 2019-173420

(51) Int. Cl.  
*C23C 16/448* (2006.01)
(52) U.S. Cl.  
CPC .................................. *C23C 16/448* (2013.01)

(58) Field of Classification Search  
CPC ........................ C23C 16/448; C23C 16/4486  
See application file for complete search history.

(56) References Cited

U.S. PATENT DOCUMENTS

| | | | |
|---|---|---|---|
| 5,015,330 A * | 5/1991 | Okumura | H01J 37/32357 156/917 |
| 10,141,209 B2 * | 11/2018 | Itonaga | H01L 21/67017 |
| 2003/0131885 A1 * | 7/2003 | Birtcher | F17C 13/04 137/240 |
| 2009/0186479 A1 * | 7/2009 | Okabe | C23C 16/4486 257/E21.16 |

(Continued)

FOREIGN PATENT DOCUMENTS

| | | |
|---|---|---|
| CN | 102560430 A | 7/2012 |
| JP | H08186103 A | 7/1996 |

(Continued)

*Primary Examiner* — Jeremy Carroll  
(74) *Attorney, Agent, or Firm* — Nath, Goldberg & Meyer; Jerald L. Meyer; Tanya E. Harkins (57) ABSTRACT

A raw material supply apparatus according to an aspect of the present disclosure includes: a container configured to store a solution of a first solid raw material dissolved in a solvent or a dispersion system of the first solid raw material dispersed in a dispersion medium; a removal part configured to form a second solid raw material by removing the solvent or the dispersion medium from the solution or the dispersion system stored in the container; a detection part configured to detect a completion of a removal of the solvent or the dispersion medium from the solution or the dispersion system; and a heater configured to heat the second solid raw material.

9 Claims, 6 Drawing Sheets

(56) References Cited

U.S. PATENT DOCUMENTS

2023/0151486 A1\* 5/2023 Komori ............... C23C 16/4481
118/712

FOREIGN PATENT DOCUMENTS

| JP | 11-293463 A | 10/1999 |
|----|-------------|---------|
| JP | 2004115831 A | 4/2004 |
| JP | 2004256864 A | 9/2004 |
| WO | 2005087975 A1 | 9/2005 |

\* cited by examiner

RAW MATERIAL SUPPLY APPARATUS AND RAW MATERIAL SUPPLY METHOD

This is a National Phase Application filed under 35 U.S.C. 371 as a national stage of PCT/JP2020/034971, filed Sep. 15, 2020, an application claiming the benefit of Japanese Application No. 2019-173420, filed Sep. 24, 2019, the content of each of which is hereby incorporated by reference in its entirety.

TECHNICAL FIELD

The present disclosure relates to a raw material supply apparatus and a raw material supply method.

BACKGROUND

There is known a technique of confirming that a liquid raw material is filled to a position where the liquid raw material can be sprayed in a liquid raw material vaporization mechanism that vaporizes the liquid raw material through spraying when forming a thin film for a semiconductor element on a substrate surface by spraying and vaporizing the liquid raw material (see, for example, Patent Document 1).

PRIOR ART DOCUMENTS

Patent Documents

Patent Document 1: Japanese Laid-Open Patent Publication No. 11-293463

The present disclosure provides a technique capable of detecting that the separation of a solvent or a dispersion medium contained in a solution or a dispersion system from a solid raw material is completed.

SUMMARY

A raw material supply apparatus according to an aspect of the present disclosure includes: a container configured to store a solution of a first solid raw material dissolved in a solvent or a dispersion system of the first solid raw material dispersed in a dispersion medium; a removal part configured to form a second solid raw material by removing the solvent or the dispersion medium from the solution or the dispersion system stored in the container; a detection part configured to detect a completion of a removal of the solvent or the dispersion medium from the solution or the dispersion system; and a heater configured to heat the second solid raw material.

According to the present disclosure, it is possible to detect that the separation of a solvent or a dispersion medium contained in a solution or a dispersion system from a solid raw material is completed.

DETAILED DESCRIPTION

Hereinafter, non-limiting exemplary embodiments of the present disclosure will be described with reference to the accompanying drawings. In all of the accompanying drawings, the same or corresponding members or components will be denoted by the same or corresponding reference numerals, and redundant descriptions will be omitted.

Raw Material Supply System

Figure 1:
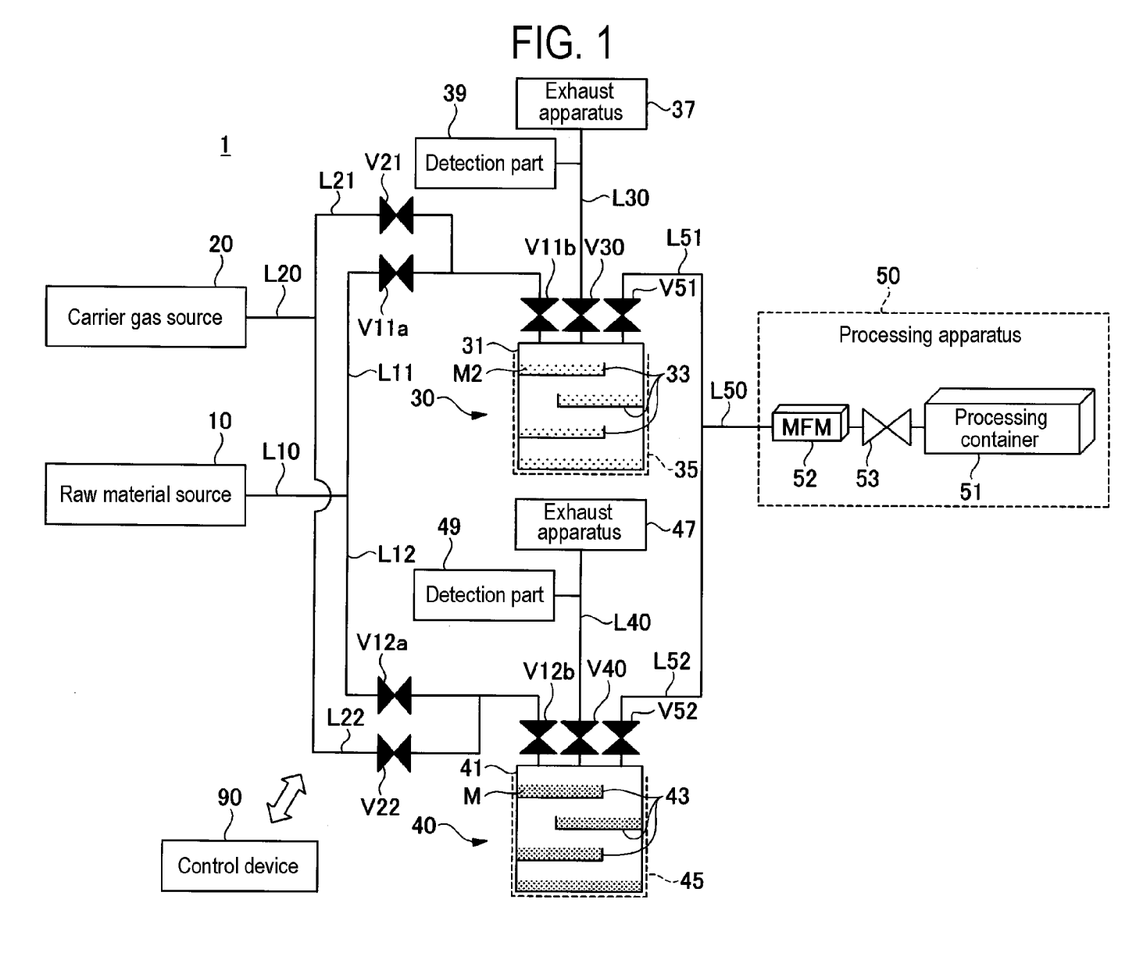
FIG. 1 is a view illustrating an example of a raw material supply system.

The FIG. 1 is a view illustrating an example of a raw material supply system. As illustrated in FIG. 1, a raw material supply system 1 includes a raw material source 10, a carrier gas source 20, raw material supply apparatuses 30 and 40, a processing apparatus 50, and a controller 90.

The raw material source 10 supplies a solution of a first solid raw material dissolved in a solvent or a slurry of a first solid raw material dispersed in a solvent (a dispersion medium) to the raw material supply apparatuses 30 and 40. The form of the raw material source 10 is not particularly limited as long as the solution or the slurry M can be supplied to the raw material supply apparatuses 30 and 40.

Figure 2A:
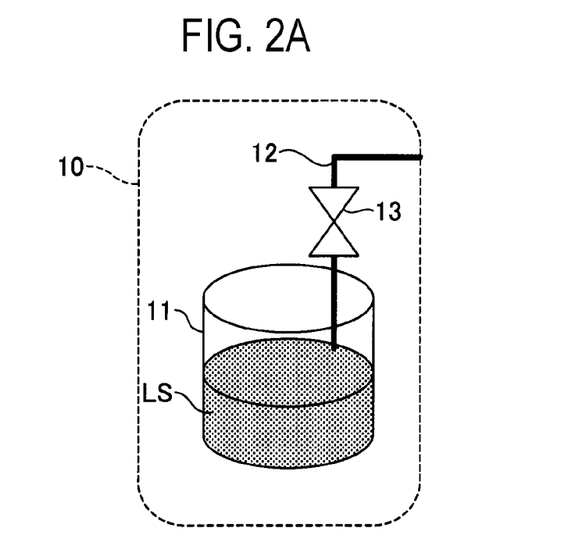
FIG. 2A is a view illustrating an exemplary raw material source.
Figure 2B:
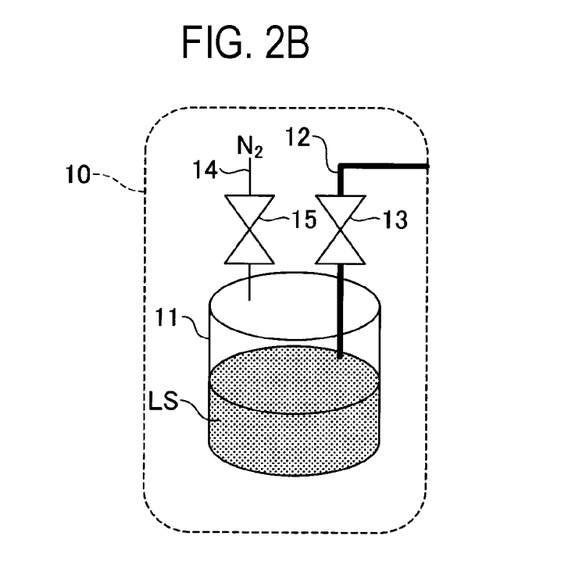
FIG. 2B is a view illustrating an exemplary raw material source.
Figure 2C:
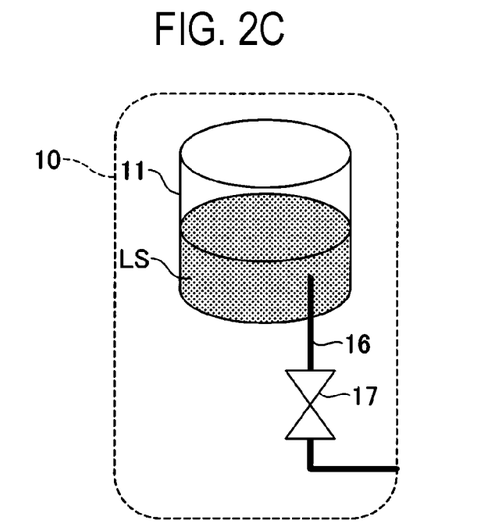
FIG. 2C is a view illustrating an exemplary raw material source.

FIGS. 2A to 2C are views illustrating exemplary raw material sources 10, which provide examples of configurations where the raw material source 10 supplies a solution of a first solid raw material dissolved in a solvent to the raw material supply apparatuses 30 and 40 are illustrated. As illustrated in FIG. 2A, the raw material source 10 includes, for example, a tank 11 filled with a solution LS, a pipe 12 inserted into the tank 11 from above, and a valve 13 interposed in the pipe 12. In the raw material source 10 illustrated in FIG. 2A, the solution LS filled in the tank 11 is supplied from the pipe 12 under pressure by its own weight. In addition, as illustrated in FIG. 2B, the raw material source 10 may include, for example, a tank 11 filled with a solution LS, pipes 12 and 14 inserted into the tank 11 from above, and valves 13 and 15 interposed in the pipes 12 and 14. In the raw material source 10 illustrated in FIG. 2B, by supplying an inert gas such as nitrogen ($N_2$) into the tank 11 from the pipe 14, the interior of the tank 11 is pressurized, and the solution LS is supplied from the pipe 12. In addition, as illustrated in FIG. 2C, the raw material source 10 may include, for example, a tank 11 filled with a solution LS, a pipe 16 connected to the bottom side of the tank 11, and a valve 17 interposed in the pipe 16. In the raw material source 10 illustrated in FIG. 2C, the solution LS is supplied from the bottom side of the tank 11 via the pipe 16 using natural fall due to gravity.

Figure 3:
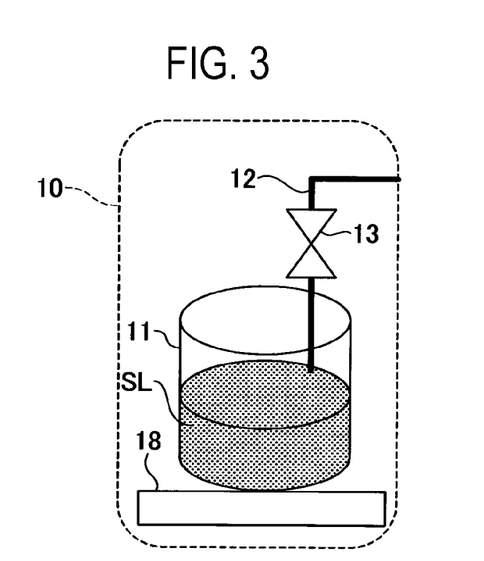
FIG. 3 is a view illustrating another exemplary raw material source.

FIG. 3 is a view illustrating another exemplary raw material source 10, in which a configuration example in which the raw material source 10 supplies a slurry of a first solid raw material dispersed in a solvent to the raw material supply apparatuses 30 and 40 is illustrated. As illustrated in FIG. 3, for example, the raw material source 10 includes a tank 11 filled with a slurry SL, a pipe 12 inserted into the tank 11 from above, a valve 13 interposed in the pipe 12, and a vibration stage 18 configured to vibrate the tank 11. In the raw material source 10 illustrated in FIG. 3, the slurry SL is supplied from the pipe 12 by pressurizing the slurry SL filled in the tank 11 by its own weight while vibrating the tank 11 placed on the vibration stage 18.

The raw material source 10 is connected to a raw material supply apparatus 30 via pipes L10 and L11 and thus supplies a solution of the first solid raw material dissolved in a solvent or a slurry of the first solid raw material dispersed in a solvent to the raw material supply apparatus 30 via the pipes L10 and L11. Valves V11a and V11b are interposed in the pipe L11. When the valves V11a and V11b are opened, the solution or slurry M is supplied from the raw material source 10 to the raw material supply apparatus 30, and when the valves V11a and V11b are closed, the supply of the solution or slurry M from the raw material source 10 to the raw material supply apparatus 30 is blocked. In addition, the pipe L11 may be provided with a flow rate controller (not illustrated), an additional valve, or the like that controls the flow rate of the solution or slurry M flowing through the pipe L11.

In addition, the raw material source 10 is connected to a raw material supply apparatus 40 via pipes L10 and L12 and thus supplies the solution of the first solid raw material dissolved in the solvent or slurry of the first solid raw material dispersed in the solvent to the raw material supply apparatus 40 via the pipes L10 and L12. Valves V12a and V12b are interposed in the pipe L12. When the valves V12a and V12b are opened, the solution or slurry M is supplied from the raw material source 10 to the raw material supply apparatus 40, and when the valves V12a and V12b are closed, the supply of the solution or slurry M from the raw material source 10 to the raw material supply apparatus 40 is blocked. In addition, the pipe L12 may be provided with a flow rate controller (not illustrated), an additional valve, or the like that controls the flow rate of the solution or slurry M flowing through the pipe L12.

The first solid raw material is not particularly limited, but may be, for example, an organic metal complex containing a metal element such as strontium (Sr), molybdenum (Mo), ruthenium (Ru), zirconium (Zr), hafnium (Hf), tungsten (W), or aluminum (Al), or a chloride containing a metal element such as tungsten (W) or aluminum (Al).

The solvent may be hexane, for example, as long as it can dissolve or disperse the first solid raw material to form a solution or slurry M.

The carrier gas source 20 supplies a carrier gas to the raw material supply apparatuses 30 and 40. The carrier gas source 20 is connected to the pipe L11 via the pipes L20 and L21, and supplies the carrier gas to the raw material supply apparatus 30 via the pipes L20, L21, and L11. A valve V21 is interposed in the pipe L21. When the valves V21 and V11b are opened, the carrier gas is supplied from the carrier gas source 20 to the raw material supply apparatus 30, and when the valves V21 and V11b are closed, the supply of the carrier gas from the carrier gas source 20 to the raw material supply apparatus 30 is blocked. In addition, the pipe L21 may be provided with a flow rate controller (not illustrated), an additional valve, or the like that controls the flow rate of the carrier gas flowing through the pipe L21.

In addition, the carrier gas source 20 is connected to the pipe L12 via the pipes L20 and L22, and supplies the carrier gas to the raw material supply apparatus 40 via the pipes L20, L22, and L12. A valve V22 is interposed in the pipe L22. When the valves V22 and V12b are opened, the carrier gas is supplied from the carrier gas source 20 to the raw material supply apparatus 40, and when the valves V22 and V12b are closed, the supply of the carrier gas from the carrier gas source 20 to the raw material supply apparatus 40 is blocked. In addition, the pipe L22 may be provided with a flow rate controller (not illustrated), an additional valve, or the like that controls the flow rate of the carrier gas flowing through the pipe L22.

The carrier gas is not particularly limited, but may be, for example, an inert gas such as nitrogen ($N_2$) or argon (Ar).

The raw material supply apparatus 30 stores the solution of the first solid raw material dissolved in the solvent or the slurry of the first solid raw material dispersed in the solvent, wherein the solution or slurry is supplied from the raw material source 10. The raw material supply apparatus 30 includes a container 31, a storage part 33, a heater 35, an exhaust apparatus 37, and a detection part 39.

The container 31 stores the solution or slurry M. For example, the tip end of the pipe L11 is inserted into the container 31 from above, and the solution or slurry M and the carrier gas are supplied via the pipe L11. For example, a spray nozzle may be installed at the tip end of the pipe L11. In addition, for example, the tip end of a pipe L51 is inserted into the container 31 from above, and a reactive gas generated in the container 31 is supplied to the processing apparatus 50 via the pipe L51. Furthermore, for example, the tip end of a pipe L30 is inserted into the container 31 from above, and the interior of the container 31 is evacuated through the pipe L30, whereby the solvent is removed from the solution or slurry M in the container 31 so that a second solid raw material M2 is formed.

Plural storage parts 33 are provided in the container 31 to store the solution or slurry M. The storage parts 33 have, for example, a tray shape having an opening in upper portion thereof. By providing the plural storage parts 33 in the container 31, a specific surface area, which is the surface area per unit volume of the solution or slurry M stored in the container 31, increases so that the time for removing the solvent from the solution or slurry M can be shortened.

The heater 35 heats the second solid raw material M2 formed by removing the solvent from the solution or slurry M, thereby sublimating the second solid raw material M2 to generate a reactive gas. The heater 35 may be, for example, a heater disposed so as to cover the bottom portion and the outer periphery of the container 31. The heater 35 is configured to heat the interior of the container 31 to a temperature at which the second solid raw material M2 can be sublimated to generate a reactive gas.

The exhaust apparatus 37 is connected to the container 31 via the pipe L30 and evacuates the interior of the container 31. When the interior of the container 31 in which the solution or slurry M is stored is evacuated by the exhaust apparatus 37, the solvent is removed from the solution or slurry M in the container 31, so that the second solid raw material M2 is formed. A valve V30 is interposed in the pipe L30. When the valve V30 is opened, the interior of the container 31 is evacuated, and when the valve V30 is closed, the evacuation of the interior of the container 31 is blocked. The exhaust apparatus 37 is an example of the removal part and includes a pressure adjusting valve, a vacuum pump, and the like.

The detection part 39 is interposed in the pipe L30. The detection part 39 detects whether or not the removal of the solvent from the solution or slurry M stored in the container 31 is completed by analyzing the components contained in the fluid flowing through the pipe L30. The detection part 39 includes at least one of a quadrupole mass spectrometer (QMS), a quantum cascade laser (QCL), an optical emission spectroscopy (OES), and a pressure gauge.

In the example of FIG. 1, the case where the pipe L21 for supplying the carrier gas is connected to the pipe L11 for supplying the solution or slurry M has been described, but the present disclosure is not limited thereto. For example, the tip end of the pipe L21 for supplying the carrier gas may be directly inserted into the container 31.

In addition, in the example of FIG. 1, the case where the pipe L30 for evacuating the interior of the container 31 is inserted into the container 31 separately from the pipe L51 for supplying a reactive gas to the processing apparatus 50 has been described, but the present disclosure is not limited thereto. For example, the pipe L30 for evacuating the interior of the container 31 may be connected to the pipe L51 for supplying a reactive gas to the processing apparatus 50.

The raw material supply apparatus 40 is provided in parallel with the raw material supply apparatus 30. The raw material supply apparatus 40 stores the solution of the first solid raw material dissolved in the solvent or the slurry of the first solid raw material dispersed in the solvent, wherein the solution or slurry is supplied from the raw material source 10. The raw material supply apparatus 40 includes a container 41, a storage part 43, a heater 45, an exhaust apparatus 47, and a detection part 49.

The container 41 stores the solution or slurry M. For example, the tip end of the pipe L12 is inserted into the container 41 from above, and the solution or slurry M and the carrier gas are supplied via the pipe L12. For example, a spray nozzle may be installed to the tip end of the pipe L12. In addition, for example, the tip end of a pipe L52 is inserted into the container 41 from above, and a reactive gas generated in the container 41 is supplied to the processing apparatus 50 via the pipe L52. Furthermore, for example, the tip end of a pipe L40 is inserted into the container 41 from above, and the interior of the container 41 is evacuated through the pipe L40, whereby the solvent is removed from the solution or slurry M in the container 41 so that a second solid raw material M2 is formed.

A plurality of storage parts 43 are provided in the container 41 to store the solution or slurry M. The storage parts 43 have, for example, a tray shape having an opening in upper portion thereof. By providing plural storage parts 43 in the container 41, a specific surface area, which is the surface area per unit volume of the solution or slurry M stored in the container 41, increases so that the time for removing the solvent from the solution or slurry M can be shortened.

The heater 45 heats the second solid raw material M2 formed by removing the solvent from the solution or slurry M, thereby sublimating the second solid raw material M2 to generate a reactive gas. The heater 45 may be, for example, a heater disposed so as to cover the bottom portion and the outer periphery of the container 41. The heater 45 is configured to be able to heat the interior of the container 41 to a temperature at which the second solid raw material M2 can be sublimated to generate a reactive gas.

The exhaust apparatus 47 is connected to the container 41 via the pipe L40 and evacuates the interior of the container 41. When the interior of the container 41 in which the solution or slurry M is stored is evacuated by the exhaust apparatus 47, the solvent is removed from the solution or slurry M in the container 41, so that the second solid raw material M2 is formed. A valve V40 is interposed in the pipe L40. When the valve V40 is opened, the interior of the container 41 is evacuated, and when the valve V40 is closed, the evacuation of the interior of the container 41 is blocked.

The exhaust apparatus 47 is an example of the removal part and includes a pressure adjusting valve, a vacuum pump, and the like.

The detection part 49 is interposed in the pipe L40. The detection part 49 detects whether or not the removal of the solvent from the solution or slurry M injected into the container 41 is completed by analyzing the components contained in the fluid flowing through the pipe L40. Like the detection part 39, the detection part 49 includes at least one of a QMS, a QCL, an OES, and a pressure gauge.

In the example of FIG. 1, the case where the pipe L22 for supplying the carrier gas is connected to the pipe L12 for supplying the solution or slurry M has been described, but the present disclosure is not limited thereto. For example, the tip end of the pipe L22 for supplying the carrier gas may be directly inserted into the container 41.

In addition, in the example of FIG. 1, the case where the pipe L40 for evacuating the interior of the container 41 is inserted into the container 41 separately from the pipe L52 for supplying a reactive gas to the processing apparatus 50 has been described, but the present disclosure is not limited thereto. For example, the pipe L40 for evacuating the interior of the container 41 may be connected to the pipe L52 for supplying a reactive gas to the processing apparatus 50.

The processing apparatus 50 is connected to the raw material supply apparatus 30 via the pipes L51 and L50, and the processing apparatus 50 is supplied with a reactive gas generated by heating and sublimating the second solid raw material M2 in the raw material supply apparatus 30. A valve V51 is interposed in the pipe L51. When the valve V51 is opened, the reactive gas is supplied from the raw material supply apparatus 30 to the processing apparatus 50, and when the valve V51 is closed, the supply of the reactive gas from the raw material supply apparatus 30 to the processing apparatus 50 is blocked.

In addition, the processing apparatus 50 is connected to the raw material supply apparatus 40 via the pipes L52 and L50, and the processing apparatus 50 is supplied with a reactive gas generated by heating and sublimating the second solid raw material M2 in the raw material supply apparatus 40. A valve V52 is interposed in the pipe L52. When the valve V52 is opened, the reactive gas is supplied from the raw material supply apparatus 40 to the processing apparatus 50, and when the valve V52 is closed, the supply of the reactive gas from the raw material supply apparatus 40 to the processing apparatus 50 is blocked.

The processing apparatus 50 executes various processes such as a film forming process on a substrate such as a semiconductor wafer using the reactive gas supplied from the raw material supply apparatuses 30 and 40. The processing apparatus 50 includes a processing container 51, a mass flow meter 52, and a valve 53. The processing container 51 accommodates one or more substrates. The mass flow meter 52 is interposed in the pipe L50 and measures the flow rate of the reactive gas flowing through the pipe L50. The valve 53 is interposed in the pipe L50. When the valve V53 is opened, the reactive gas is supplied from the raw material supply apparatuses 30 and 40 to the processing container 51, and when the valve V53 is closed, the supply of the reactive gas from the raw material supply apparatus 30 and 40 to the processing container 51 is blocked.

The controller 90 controls each part of the raw material supply system 1. For example, the controller 90 controls the operations of the raw material source 10, the carrier gas source 20, the raw material supply apparatuses 30 and 40, the processing apparatus 50, the exhaust apparatuses 37 and 47, the detection parts 39 and 49, and the like. The controller 90 controls the opening/closing of various valves. The controller 90 is an example of the controller, and may be, for example, a computer.

End Point Detection Process

Figure 4:
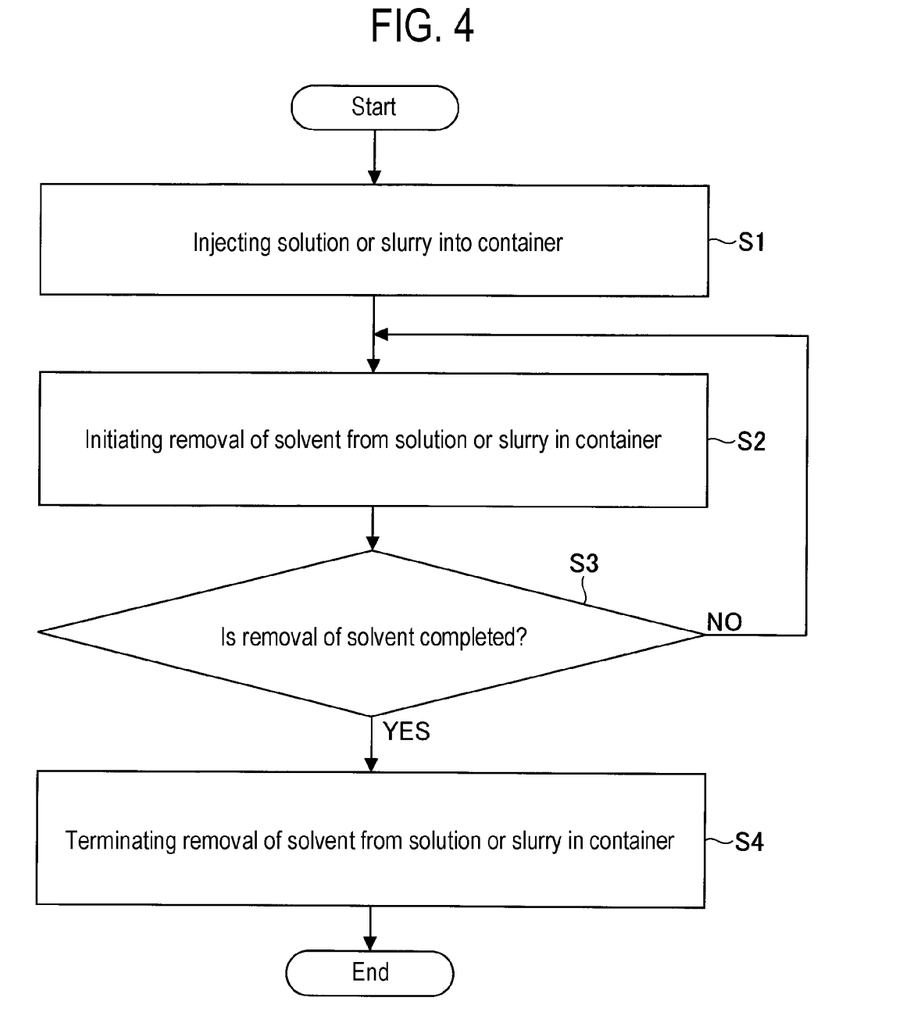
FIG. 4 is a flow chart illustrating an example of an end point detection process.

With reference to FIG. 4, an example of a process for detecting that the removal of the solvent from the solution or slurry M stored in the containers 31 and 41 of the raw material supply apparatuses 30 and 40 is completed (hereinafter referred to as an "end point detection process") will be described. FIG. 4 is a flowchart illustrating an example of the end point detection process. Hereinafter, the end point detection process in the raw material supply apparatus 30 will be described as an example. However, the end point detection process in the raw material supply apparatus 40 may be the same as the end point detection process in the raw material supply apparatus 30.

First, the controller 90 controls the opening/closing of the raw material source 10 and various valves so that the solution or slurry M is injected into the container 31 (step S1). In step S1, for example, after a predetermined time has elapsed, the controller 90 controls the opening/closing of the raw material source 10 and various valves to terminate the injection of the solution or slurry M into the container 31. Furthermore, in step S1, for example, after a predetermined amount of solution or slurry M is supplied into the container 31, the controller 90 may control the raw material source 10 and various valves to terminate the injection of the solution or slurry M into the container 31. As described above, the timing at which the injection of the solution or the slurry M into the container 31 is terminated in step S1 may be determined based on various conditions.

Subsequently, the controller 90 controls the opening and closing of the exhaust apparatus 37 and various valves to evacuate the interior of the container 31, thereby initiating the removal of the solvent from the solution or slurry M stored in the container 31 (step S2).

Subsequently, the controller 90 acquires a detection result from the detection part 39, and determines whether or not the removal of the solvent from the solution or slurry M stored in the container 31 is completed based on the detection result (step S3). For example, when the detection part 39 is a pressure gauge, the controller 90 determines that the removal of the solvent from the solution or slurry M stored in the container 31 is completed when the pressure gauge detects a pressure equal to or lower than a predetermined pressure. The predetermined pressure is determined by, for example, a preliminary experiment or the like.

When it is determined in step S3 that the removal of the solvent from the solution or slurry M is completed, the controller 90 controls the opening/closing of the exhaust apparatus 37 and various valves to terminate the removal of the solvent from the solution or slurry M in the container 31 (step S4) and finishes the process. Meanwhile, when it is determined in step S3 that the removal of the solvent from the solution or slurry M has not been completed, the controller 90 returns the process to step S2. That is, step S2 is repeated until the removal of the solvent from the solution or slurry M is completed.

According to the end point detection process described above, the controller 90 detects that the removal of the solvent from the solution or slurry M stored in the container 31 is completed based on the detection result from the detection part 39 interposed in the pipe L30 that connects the container 31 and the exhaust apparatus 37 to each other. As a result, it is possible to detect that the separation of the solvent contained in the solution or slurry M stored in the container 31 from the solid raw material is completed.

Operation of Raw Material Supply System

An example of the operation of the raw material supply system 1 (a raw material supply method) will be described. In the raw material supply system 1, the controller 90 controls the opening/closing of various valves to supply a reactive gas from one of the two raw material supply apparatuses 30 and 40 provided in parallel to the processing apparatus 50, and to fill the other one of the two raw material supply apparatuses 30 and 40 with a solid raw material. Hereinafter, an example of the operation of the raw material supply system 1 will be described in detail.

Figure 5:
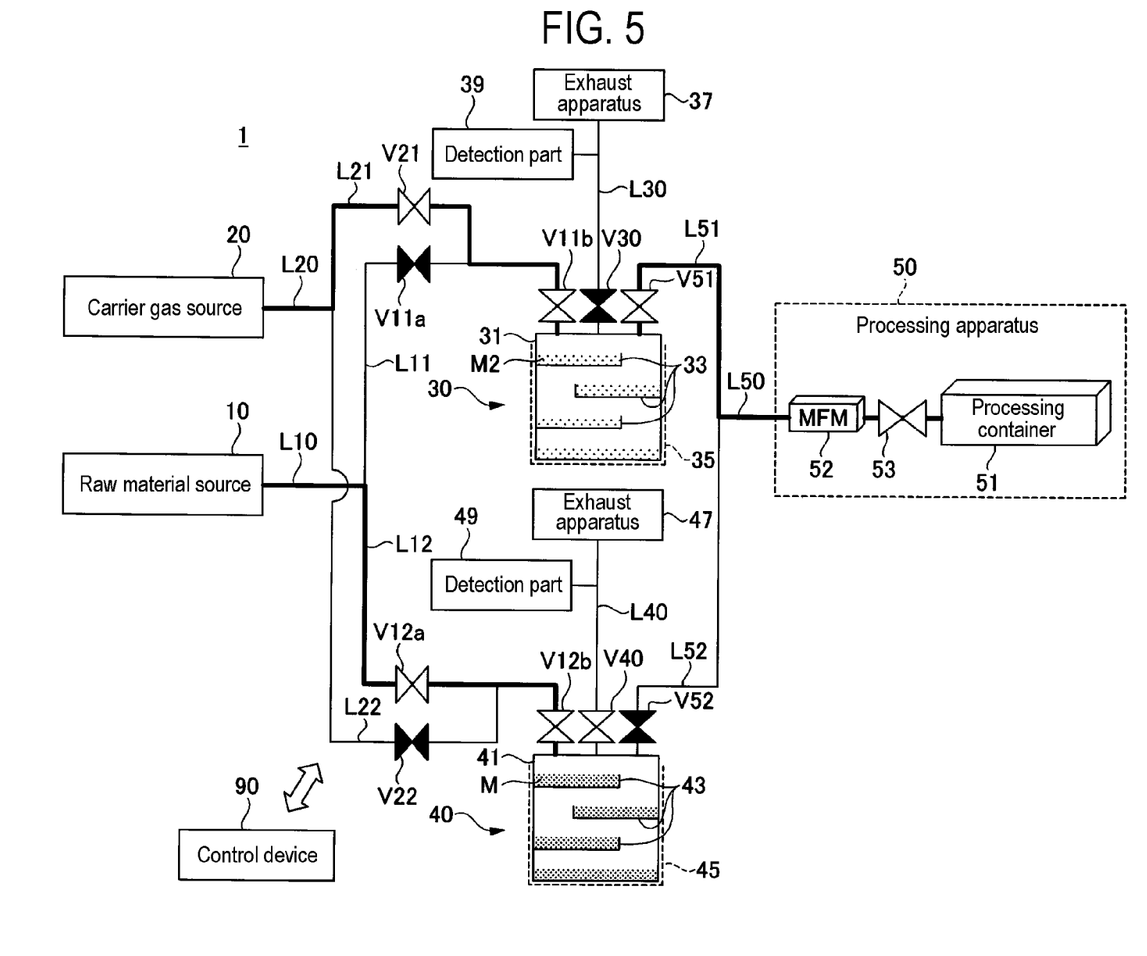
FIG. 5 is a view (1) for describing an operation of the raw material supply system.

First, with reference to FIG. 5, a case where the raw material supply apparatus 30 supplies a reactive gas to the processing apparatus 50 and the raw material supply apparatus 40 is filled with a solid raw material will be described. FIG. 5 is a view for explaining the operation of the raw material supply system 1. In FIG. 5, the pipes through which the carrier gas, the solution or slurry M, and the reactive gas are flowing are indicated by thick solid lines, and the pipes in which the carrier gas, the solution or slurry M, and the reactive gas are not flowing are indicated by thin solid lines. In the raw material supply system 1, as illustrated in FIG. 1, it is assumed that the valves V11a, V11b, V12a, V12b, V21, V22, V30, V40, V51, and V52 are all closed in the initial state. It is also assumed that the second solid raw material M2 is stored in the raw material supply apparatus 30.

The controller 90 controls the heater 35 of the raw material supply apparatus 30 to heat and sublimate the second solid raw material M2 stored in the storage parts 33 in the container 31, thereby generating the reactive gas. In addition, the controller 90 opens the valves V21, V11b, and V51. As a result, the carrier gas is injected from the carrier gas source 20 into the container 31 of the raw material supply apparatus 30 via the pipes L20, L21, and L11, and the reactive gas generated in the container 31 is supplied to the processing apparatus 50 via the pipes L50 and L51 together with the carrier gas. In addition, the controller 90 opens the valves V12a and V12b. As a result, the solution or slurry M is injected from the raw material source 10 into the raw material supply apparatus 40 via the pipes L10 and L12, and the solution or slurry M is stored in the storage parts 43 in the container 41 of the raw material supply apparatus 40. After a predetermined amount of solution or slurry M is stored in the storage parts 43 in the container 41, the controller 90 closes the valves V12a and V12b and opens the valve V40. As a result, the interior of the container 41 is evacuated by the exhaust apparatus 47, and the solvent is removed from the solution or slurry M stored in the container 41. At this time, the controller 90 acquires a detection result from the detection part 49, and determines whether or not the removal of the solvent from the solution or slurry M stored in the container 41 is completed based on the detection result. When the controller 90 determines that the removal of the solvent from the solution or the slurry M stored in the container 41 is completed, the controller 90 closes the valve V40. As a result, the evacuation of the interior of the container 41 by the exhaust apparatus 47 is blocked.

Figure 6:
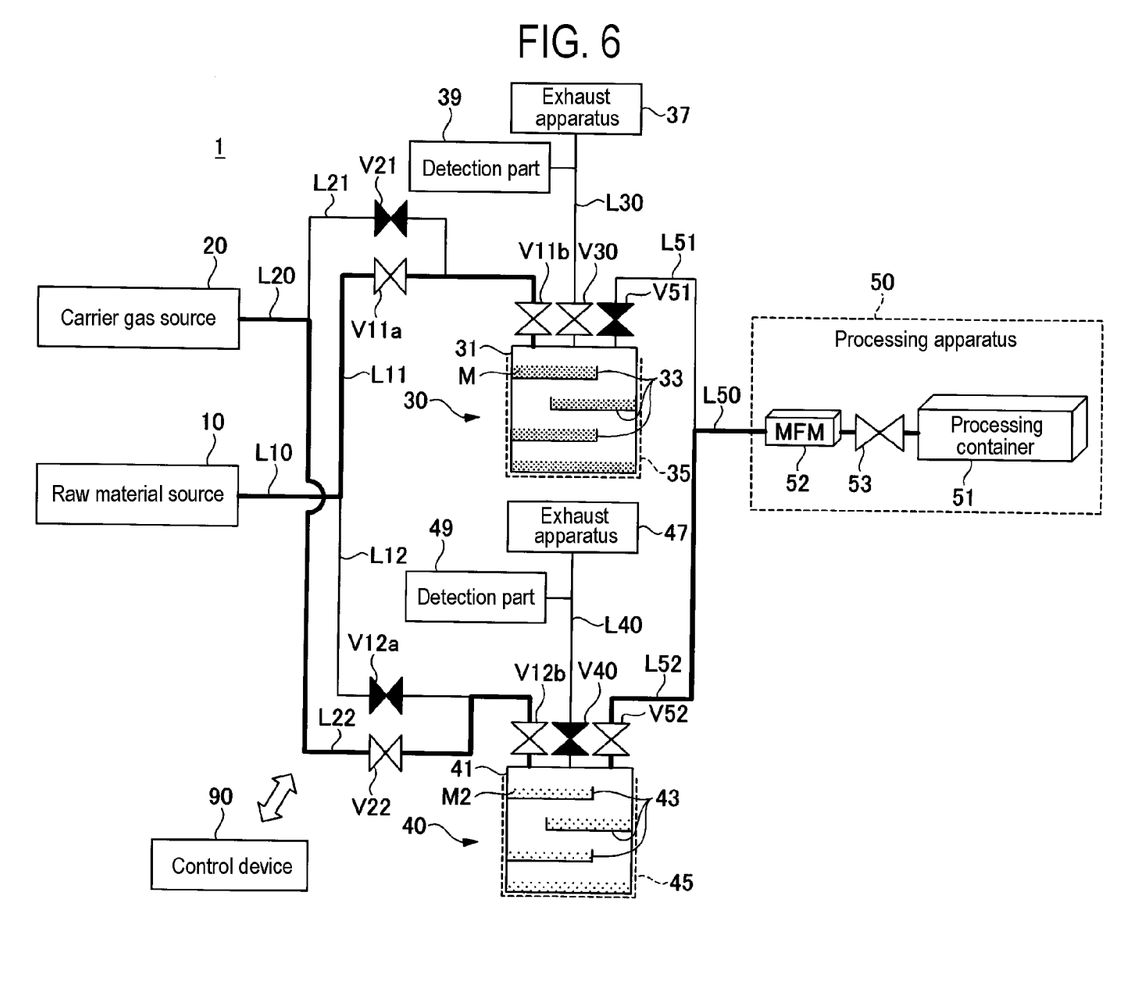
FIG. 6 is a view (2) for describing an operation of the raw material supply system.

Next, with reference to FIG. 6, a description is made of the case where the state in which the raw material supply apparatus 30 supplies the reactive gas to the processing apparatus 50 (see FIG. 5) is switched to the state in which the raw material supply apparatus 40 supplies the reactive gas to the processing apparatus 50 and the raw material supply apparatus 30 is filled with the solid raw material. The switching is executed, for example, when the removal of the solvent from the solution or slurry M stored in the container 31 of the raw material supply apparatus 30 is completed, and the remaining amount of the second solid raw material M2 stored in the container 41 of the raw material supply apparatus 40 becomes a predetermined value or less.

FIG. 6 is a view for explaining the operation of the raw material supply system 1. In FIG. 6, the pipes through which the carrier gas, the solution or slurry M, and the reactive gas are flowing are indicated by thick solid lines, and the pipes in which the carrier gas, the solution or slurry M, and the reactive gas are not flowing are indicated by thin solid lines. In the raw material supply system 1, it is assumed that the valves V11b, V21, and V51 are opened, and the valves V11a, V12a, V12b, V22, V30, V40, and V52 are closed in the state before switching.

First, the controller 90 turns off the heater 35 of the raw material supply apparatus 30 and closes the valves V11b, V21, and V51. As a result, the supply of the reactive gas from the raw material supply apparatus 30 to the processing apparatus 50 is stopped.

The controller 90 continuously controls the heater 45 of the raw material supply apparatus 40 to heat and sublimate the second solid raw material M2 stored in the storage parts 43 in the container 41, thereby generating the reactive gas. In addition, the controller 90 opens the valves V22, V12b, and V52. As a result, the carrier gas is injected from the carrier gas source 20 into the container 41 of the raw material supply apparatus 40 via the pipes L20, L22, and L12, and the reactive gas generated in the container 41 is supplied to the processing apparatus 50 via the pipes L50 and L52 together with the carrier gas. In addition, the controller 90 opens the valves V11a and V11b. As a result, the solution or slurry M is injected from the raw material source 10 into the raw material supply apparatus 30 via the pipes L10 and L11, and the solution or slurry M is stored in the storage parts 33 in the container 31 of the raw material supply apparatus 30. After a predetermined amount of solution or slurry M is stored in the storage parts 33 in the container 31, the controller 90 closes the valves V11a and V11b and opens the valve V30. As a result, the interior of the container 31 is evacuated by the exhaust apparatus 37, and the solvent is removed from the solution or slurry M stored in the container 31. At this time, the controller 90 acquires a detection result from the detection part 39, and determines whether or not the removal of the solvent from the solution or slurry M stored in the container 31 is completed based on the detection result. When the controller 90 determines that the removal of the solvent from the solution or the slurry M stored in the container 31 is completed, the controller 90 closes the valve V30. As a result, the evacuation of the interior of the container 31 by the exhaust apparatus 37 is blocked.

With the raw material supply system 1, the controller 90 controls the opening/closing of various valves to supply a reactive gas from one of the two raw material supply apparatuses 30 and 40 to the processing apparatus 50, and to fill the other one of the two raw material supply apparatuses 30 and 40 with a solid raw material. This makes it possible for the raw material to be automatically replenished to the raw material supply apparatuses 30 and 40 so that the continuous operation capacity of the processing apparatus 50 can be improved, and the operating rate of the processing apparatus 50 can be improved.

In addition, with the raw material supply system 1, the controller 90 detects that the removal of the solvent from the solution or slurry M stored in the container 31 is completed based on the detection result from the detection part 39 interposed in the pipe L30 that connects the container 31 and the exhaust apparatus 37 to each other. As a result, it is possible to detect that the separation of the solvent contained in the solution or slurry M stored in the container 31 from the solid raw material is completed.

In addition, with the raw material supply system 1, the controller 90 detects that the removal of the solvent from the solution or slurry M stored in the container 41 is completed based on the detection result from the detection part 49 interposed in the pipe L40 that connects the container 41 and the exhaust apparatus 47 to each other. As a result, it is possible to detect that the separation of the solvent contained in the solution or slurry M stored in the container 41 from the solid raw material is completed.

The embodiments disclosed herein should be considered to be exemplary in all respects and not restrictive. The above-described embodiments may be omitted, replaced, or modified in various forms without departing from the scope and spirit of the appended claims.

In the above-described embodiments, a solution of a first solid raw material dissolved in a solvent or a slurry of a first solid raw material dispersed in a dispersion medium has been described as an example, but the present disclosure is not limited thereto. For example, instead of the slurry, a dispersion system such as a colloidal solution of the first solid raw material dispersed in a dispersion medium may also be used. For example, by using a colloidal solution, it is possible to fill a precursor having a higher concentration than that in the case of using a solution or slurry. The dispersion system includes a slurry and a colloid as subordinate concepts. The slurry is also referred to as a suspension. The colloid includes a colloidal solution as a subordinate concept. The colloidal solution is also referred to as sol.

The present international application claims priority based on Japanese Patent Application No. 2019-173420 filed on Sep. 24, 2019, the disclosure of which is incorporated herein in its entirety by reference.

EXPLANATION OF REFERENCE NUMERALS

1: raw material supply system, 30: raw material supply apparatus, 31: container, 33: storage part, 35: heater, 40: raw material supply apparatus, 41: container, 43: storage part, 45: heater

What is claimed is:

1. A raw material supply apparatus comprising:
a container configured to store a solution of a first solid raw material dissolved in a solvent or a dispersion system of the first solid raw material dispersed in a dispersion medium;
a removal part configured to form a second solid raw material by removing the solvent or the dispersion medium from the solution or the dispersion system stored in the container;
a detection part configured to detect a completion of a removal of the solvent or the dispersion medium from the solution or the dispersion system; and
a heater configured to heat the second solid raw material.

2. The raw material supply apparatus of claim 1, wherein the removal part includes an exhaust apparatus configured to evacuate an interior of the container, wherein the detection part is interposed in a pipe that connects the container and the exhaust apparatus to each other.

3. The raw material supply apparatus of claim 2, wherein the detection part includes at least one of QMS, QCL, OES, and a pressure gauge.

4. The raw material supply apparatus of claim 3, further comprising:
a plurality of storage parts provided in the container to store the solution or the dispersion system.

5. The raw material supply apparatus of claim 4, further comprising:
a controller,
wherein the controller is configured to control the removal part and the detection part to execute:
injecting the solution or the dispersion system into the container;
removing the solvent or the dispersion medium from the solution or the dispersion system injected into the container; and
determining whether or not the removal of the solvent or the dispersion medium from the solution or the dispersion system is completed.

6. The raw material supply apparatus of claim 1, wherein the detection part includes at least one of QMS, QCL, OES, and a pressure gauge.

7. The raw material supply apparatus of claim 1, further comprising:
a plurality of storage parts provided in the container to store the solution or the dispersion system.

8. The raw material supply apparatus of claim 1, further comprising:
a controller,
wherein the controller is configured to control the removal part and the detection part to execute:
injecting the solution or the dispersion system into the container;
removing the solvent or the dispersion medium from the solution or the dispersion system injected into the container; and
determining whether or not the removal of the solvent or the dispersion medium from the solution or the dispersion system is completed.

9. A raw material supply method comprising:
injecting, into a container, a solution of a first solid raw material dissolved in a solvent or a dispersion system of the first solid raw material dispersed in a dispersion medium;
removing the solvent or the dispersion medium from the solution or the dispersion system injected into the container;
determining whether or not a removal of the solvent or the dispersion medium from the solution or the dispersion system is completed; and
heating a second solid raw material formed by removing the solvent or the dispersion medium from the solution or the dispersion system when it is determined that the removal of the solvent or the dispersion medium is completed in the determining.

* * * * *